(12) United States Patent
Chen et al.

(10) Patent No.: US 6,642,549 B2
(45) Date of Patent: *Nov. 4, 2003

(54) METHOD OF FORMING A WINDOW FOR A GALLIUM NITRIDE LIGHT EMITTING DIODE

(76) Inventors: John Chen, 19347 Andrada Dr., Rowland Heights, CA (US) 91748; Bingwen Liang, 995-3 Asilomar Ter., Sunnyvale, CA (US) 94086; Robert Shih, 12650 Belmont Pl., Cernitos, CA (US) 90703

( * ) Notice: Subject to any disclaimer, the term of this patent is extended or adjusted under 35 U.S.C. 154(b) by 0 days.

This patent is subject to a terminal disclaimer.

(21) Appl. No.: 10/197,614

(22) Filed: Jul. 15, 2002

(65) Prior Publication Data

US 2003/0010994 A1 Jan. 16, 2003

Related U.S. Application Data

(63) Continuation of application No. 09/626,445, filed on Jul. 26, 2000, now Pat. No. 6,420,736.

(51) Int. Cl.$^7$ .............................................. H01L 33/00
(52) U.S. Cl. ............................ 257/99; 257/81; 257/94; 257/96; 257/103
(58) Field of Search ............................ 257/99, 81, 94, 257/96, 103

(56) References Cited

U.S. PATENT DOCUMENTS

| | | | | |
|---|---|---|---|---|
| 5,344,791 A | * | 9/1994 | Huang | 117/89 |
| 5,481,122 A | * | 1/1996 | Jou et al. | 257/94 |
| 5,789,768 A | * | 8/1998 | Lee et al. | 257/96 |
| 6,078,064 A | * | 6/2000 | Ming-Jiunn et al. | 257/103 |
| 6,169,298 B1 | * | 1/2001 | Lin et al. | 257/103 |
| 6,204,512 B1 | * | 3/2001 | Nakamura et al. | 257/13 |
| 6,207,972 B1 | * | 3/2001 | Chen et al. | 257/94 |
| 6,225,648 B1 | * | 5/2001 | Hsieh et al. | 257/95 |
| 6,287,947 B1 | * | 9/2001 | Ludowise et al. | 438/606 |
| 6,420,732 B1 | * | 7/2002 | Kung et al. | 257/79 |
| 6,420,736 B1 | * | 7/2002 | Chen et al. | 257/99 |

* cited by examiner

*Primary Examiner*—David Nelms
*Assistant Examiner*—Tu-Tu Ho
(74) *Attorney, Agent, or Firm*—Jean C. Edwards; Sonnenschein Nath & Rosenthal LLP

(57) ABSTRACT

A window structure for a gallium nitride (GaN)-based light emitting diode (LED) includes a Mg+ doped p window layer of a GaN compound; a thin, semi-transparent metal contact layer; and an amorphous current spreading layer formed on the contact layer. The contact layer is formed of $NiO_x/Au$ and the current spreading layer is formed of Indium Tin Oxide. The p electrode of the diode includes a titanium adhesion layer which forms an ohmic connection with the current spreading layer and a Schottky diode connection with the Mg+ doped window layer.

14 Claims, 1 Drawing Sheet

METHOD OF FORMING A WINDOW FOR A GALLIUM NITRIDE LIGHT EMITTING DIODE

This application is a continuation of the application Ser. No. 09/626,445, field Jul. 26, 2000, now U.S. Pat. No. 6,420,736.

The present invention relates to an improved window for a gallium nitride (GaN)-based light-emitting diode (LED).

BACKGROUND OF THE INVENTION

A semiconductor light-emitting diode (LED) includes a substrate, a light emitting region, a window structure, and a pair of electrodes for powering the diode. The substrate may be opaque or transparent. Light-emitting diodes which are based on gallium nitride (GaN) compounds generally include a transparent, insulating substrate, i.e., a sapphire substrate. With a transparent substrate, light may be utilized from either the substrate or from the opposite end of the LED which is termed the "window".

The amount of light generated by an LED is dependent on the distribution of the energizing current across the face of the light emitting region. It is well known in semiconductor technology that the current flowing between the electrodes tends to concentrate in a favored path directly under the electrode. This current flow tends to activate corresponding favored portions of the light-emitting region to the exclusion of portions which fall outside the favored path. Further since such favored paths fall under the opaque electrode, the generated light reaching the electrode is lost. Prior art GaN LEDs have employed conductive current spreading layers formed of nickel/gold (Ni/Au), and have a gold (Au) window bond pad mounted on such layers. In such arrangements, the Ni/Au layer and/or the Au bond pad tend to peel during the wire bonding operation to the pad.

SUMMARY OF THE INVENTION

In one embodiment consistent with the present invention, light is utilized at the output of the window structure, which includes a very thin, semi-transparent nickel oxide/gold ($NiO_x$/Au) contact layer formed on a p-doped nitride compound window layer; a semi-transparent amorphous conducting top window layer; and a p electrode structure formed of a titanium layer with a covering Au bond pad. The amorphous top layer, by way of example, may be formed of indium tin oxide (ITO), tin oxide (TO), or zinc oxide (ZnO). Layers of other amorphous, conductive, and semi-transparent oxide compounds also may be suitable for construction of the top window layer.

Advantageously, the thin $NiO_x$/Au layer provides an excellent ohmic connection to both the amorphous current spreading conducting layer and to the magnesium (Mg)-doped GaN window layer. The highly conductive amorphous layer efficiently spreads current flowing between the electrodes across the light-emitting region to improve the efficiency of the device.

Additionally, the titanium electrode passes through both the amorphous conducting layer and the underlying Ni/Au to: (a) form an ohmic contact with those layers; (b) contact the p-doped top widow layer and form a Schottky diode connection therewith; and (c) provide good adhesion between the titanium (Ti) and the magnesiusm (Mg)-doped window layer. The Schottky diode connection forces current from the electrode into the amorphous conducting layer and eliminates the tendency of the prior art structures to concentrate current in a path directly under the electrode.

BRIEF DESCRIPTION OF THE DRAWING

The FIGURE is a schematic depicting a cross-sectional view of an LED according to one embodiment consistent with the present invention.

DETAILED DESCRIPTION OF THE PREFERRED EMBODIMENTS

Figure 1:
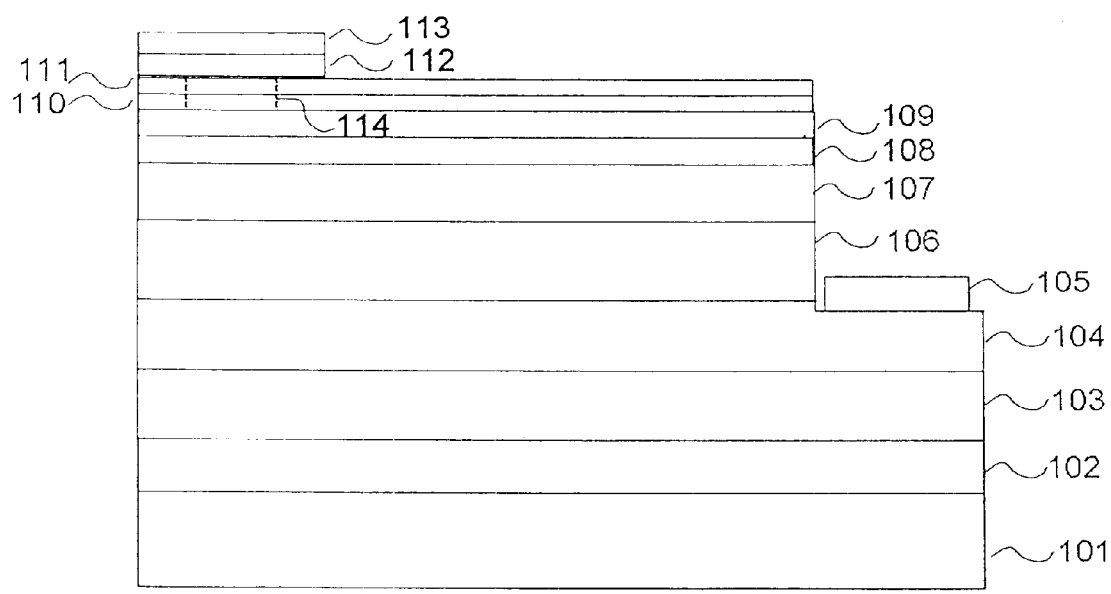

The FIGURE depicts an LED according to one embodiment consistent with the present invention, as a GaN-based device in which light exits through window 109.

The LED of the FIGURE includes a sapphire substrate 101, buffer region 102, GaN substitute substrate layer 103, n cladding layer 104, active region 106, p cladding layer 107, window layers 108, 109, n electrode 105, and a window structure which includes a thin $NiO_x$/Au semi-transparent layer 110, a semi-transparent amorphous conducting layer 111, a titanium electrode 112, and a bond pad 113.

Layers 101 through 104, and layers 106 through 109, are grown in a Metal Organic Chemical Vapor Deposition (MOCVD) reactor. The details of MOCVD growth of the stated layers are well known in the semiconductor industry and will not be discussed herein.

The remaining components of the illustrative LED, namely, layers $NiO_x$/Au layer 110, amorphous conducting layer 111, n electrode 105, p electrode 112, and bond pad 113, are formed by evaporation in an apparatus other than a MOCVD reactor. Such processes are well known in the semiconductor industry and are not described herein.

The Light-emitting Structure

The illustrative light-emitting structure of the FIGURE includes an n cladding layer 104, active region 106, and p cladding layer 107.

The n cladding layer 104 is formed of silicon-doped GaN.

In the illustrative example depicted by the FIGURE, active region 106 is a silicon-doped n-type gallium indium nitridie/gallium nitride (GaInN/GaN) multi-quantum well (MQW) structure. However, other forms of active regions may be utilized with the illustrative window structure.

The p cladding layer 107 is formed of Mg-doped aluminum gallium nitride (AlGaN).

The Window Layers

The first window layer 108 is formed of Mg-doped GaN. The window layer 108 has a nominal thickness of 300 nm.

The second window layer 109 is similarly formed of Mg-doped GaN. However, window layer 109 is more highly doped to permit an ohmic contact between layer 109 and the very thin $NiO_x$/Au layer 110.

Completion of the MOCVD Growth Process

Growth of the p-type GaN layers is achieved with the introduction of gaseous flows of TMG with hydrogen ($H_2$) as a carrier gas, $NH_3$ as a group V material, and Mg as a dopant. In the absence of an appropriate cool down protocol, hydrogen passivation of the Mg may occur, in which case, the conductivity of the Mg-doped layer is reduced.

In order to avoid hydrogen passivation of the Mg-doped layers 107, 108, and 109, the following described cool-down protocol has been adopted upon completion of the MOCVD growth.

1. The ambient gas of the reactor is switched from $H_2$ to nitrogen ($N_2$) immediately after completion of the LED structure;

2. The reactor temperature is ramped down from the growth temperature to about 900 degrees C. in about 2 minutes;

3. The flow of NH$_3$ is terminated;

4. The reactor temperature is further ramped down to about 750 degrees C. in about 2 minutes;

5. A temperature of about 750 degrees C. is held for about 20 minutes;

6. The heater of the reactor is shut off and the reactor is allowed to complete cool-down naturally. Experience shows that cool-down to 120 degrees C. occurs in about 30 minutes after heater shut off.

The resulting product exhibits the expected desired physical and electrical characteristics.

Formation of the Electrode Structures

The embodiment consistent with the present invention as depicted by the FIGURE, illustrates the locations of both p electrode layers 111, 112 and n electrode 105.

Layer 110 is a very thin, semi-transparent contact layer of NiO$_x$/Au which is deposited over the entire exposed face of window layer 109. Opening 114 is formed in layers 10 and 111 to permit the deposit of a titanium adhesion layer 112 to contact window layer 109. Titanium forms a strong physical bond with layer 109 and thus tends to eliminate peeling during wire bonding. In addition to reaching through to layer 109, titanium structure 112 is deposited through and on top of amorphous layer 111. Titanium electrode 112 forms ohmic contacts with layers 110 and 111, and forms a Schottky diode contact with window layer 109. The Schottky diode connection to window layer 109 eliminates the current path directly under the electrode and forces current flowing between the electrodes into conducting layer 111.

The p electrode Au bond pad 113 is deposited on top of titanium layer 112 to form an ohmic contact.

Since the Mg-doped layers do not suffer from hydrogen passivation, it is not necessary to heat treat the structure to activate the Mg doping in those layers. However, Ni/Au layer 111 and the Ti and Au contact structures are heated in an atmosphere of molecular nitrogen and air. Thus the Ni is converted to a form of nickel oxide. The described heat treatment improves the quality of the contact structures.

The invention has been described with particular attention to its preferred embodiment. However, it should be understood that variations and modifications within the spirit and scope of the invention may occur to those skilled in the art to which the invention pertains.

What is claimed is:

1. A method of forming a light emitting diode comprising:
   providing a substrate;
   disposing a light emitting region on said substrate;
   forming a window structure on said light emitting region, including:
     forming a Mg+ doped window layer;
     forming a semi-transparent metal contact layer on said window layer; and
     forming a semi-transparent conductive amorphous current spreading layer on said contact layer;
   forming an opening through said contact layer and said current spreading layer;
   disposing a first electrode on said window structure, said first electrode comprising a layer of titanium formed on said current spreading layer and through said opening to contact said surface of said window layer; and
   disposing a second electrode on said window structure.

2. The method of claim 1, wherein said contact layer is a NiO$_x$/Au layer.

3. The method of claim 1, wherein said amorphous current spreading layer is formed of Indium Tin Oxide.

4. The method of claim 2, wherein said amorphous current spreading layer is formed of Indium Tin Oxide.

5. The method of claim 2, wherein said window layer is Mg+ doped GaN.

6. The method of claim 1, wherein said first electrode forms a Schottky diode connection with said Mg+ doped window layer.

7. The method of claim 1, further comprising:
   forming said light emitting region and said Mg+ window layer on said substrate in a MOCVD reactor.

8. The method of claim 1, further comprising:
   forming said semi-transparent metal contact layer and said semi-transparent conductive amorphous current spreading layer by evaporation in an apparatus other than a MOCVD reactor.

9. The method of claim 1, wherein said Mg+ doped window layer is formed by:
   forming a first layer of Mg+ doped GaN, and
   forming a second layer of Mg+ doped GaN on said first layer,
   wherein said second layer is more highly doped than said first layer to permit an ohmic contact between said second layer and said semi-transparent conductive amorphous current spreading layer.

10. The method of claim 1, further comprising:
    depositing a P electrode bond pad on top of said first electrode.

11. The method of claim 10, further comprising:
    heating said metal contact layer, said current spreading layer, said first electrode and said bond pad in an atmosphere of molecular nitrogen and air.

12. The method of claim 1, wherein said light emitting region comprises an n cladding layer, an active region, and a p cladding layer.

13. A method of forming a light emitting diode comprising:
    providing a substrate;
    disposing a light emitting region on said substrate;
    forming a window structure on said light emitting region, including:
      forming a Mg+ doped window layer;
      forming a semi-transparent NiO$_x$/Au contact layer on said Mg+ doped window layer; and
      forming a semi-transparent conductive amorphous current spreading layer of indium tin oxide (ITO) on said contact layer;
    forming an opening through said contact layer and said current spreading layer;
    disposing a first electrode on said window structure, said first electrode comprising a layer of titanium formed on said current spreading layer and forming an ohmic connection therewith, said titanium of said first electrode being disposed through said opening to contact said surface of said window layer; and
    forming a Schottky diode connection between said first electrode and said Mg+ doped window layer.

14. A method of forming a light emitting diode comprising:
    providing a substrate;
    disposing a buffer region on said substrate;

disposing a GaN substitute substrate layer on said buffer region;

disposing a light emitting region on said substrate;

forming a window structure on said light emitting region, including:
- forming a double window layer;
- forming a semi-transparent metal contact layer on said double window layer; and
- forming a semi-transparent conductive amorphous current spreading layer on said contact layer;

forming an opening through said contact layer and said current spreading layer; and disposing a first electrode on said window structure, said first electrode comprising a layer of titanium formed on said current spreading layer, said titanium of said first electrode being disposed through said opening to contact said double window layer.

\* \* \* \* \*